United States Patent [19]
Crotzer et al.

[11] Patent Number: 5,600,099
[45] Date of Patent: Feb. 4, 1997

[54] CHEMICALLY GRAFTED ELECTRICAL DEVICES

[75] Inventors: David R. Crotzer, Windham, N.H.; Mark G. Hanrahan; Charles S. Pickles, both of N. Attleboro, Mass.

[73] Assignee: Augat Inc., Mansfield, Mass.

[21] Appl. No.: 348,574

[22] Filed: Dec. 2, 1994

[51] Int. Cl.⁶ .................. H05K 1/09; H05K 1/02
[52] U.S. Cl. .............. 174/257; 174/265; 174/262; 174/261; 439/82
[58] Field of Search .................. 174/261, 254, 174/257, 256, 262, 266; 361/749, 751; 439/67, 77, 59, 75, 82, 81, 45

[56] References Cited

U.S. PATENT DOCUMENTS

| | | | |
|---|---|---|---|
| 3,031,344 | 4/1962 | Sher et al. | 117/212 |
| 3,100,933 | 8/1963 | Hancock et al. | |
| 3,203,083 | 8/1965 | Obenhaus. | |
| 3,482,726 | 12/1969 | Schroeder, Jr. | 220/2.3 |
| 3,555,664 | 1/1971 | Bingham et al. | |
| 3,632,319 | 1/1972 | Hoppin et al. | 29/487 |
| 3,698,931 | 10/1972 | Horowitz | 117/47 R |
| 3,700,427 | 10/1972 | Hoppin, III et al. | |
| 3,795,047 | 3/1974 | Abolafia et al. | 29/625 |
| 3,818,415 | 6/1974 | Evans et al. | 339/17 F |
| 3,880,580 | 4/1975 | Horowitz et al. | 8/4 |
| 3,921,885 | 11/1975 | Knox | 228/116 |
| 3,929,800 | 12/1975 | Horowitz | 260/290 R |
| 3,940,377 | 2/1976 | Horowitz et al. | 260/79.5 NV |
| 4,105,811 | 8/1978 | Horowitz et al. | 427/302 |
| 4,106,955 | 8/1978 | Horowitz et al. | 148/6 |
| 4,606,778 | 8/1986 | Jahnke | 148/11.5 N |
| 4,804,132 | 2/1989 | DiFrancesco | 228/115 |
| 4,814,040 | 3/1989 | Ozawa | 156/634 |
| 5,083,697 | 1/1992 | Difrancesco | 228/116 |
| 5,118,299 | 6/1992 | Burns et al. | 439/74 |
| 5,155,301 | 10/1992 | Mase | 174/88 R |
| 5,307,561 | 3/1994 | Feigenbaum et al. | 29/846 |
| 5,371,327 | 12/1994 | Fujinami et al. | 174/257 |
| 5,371,328 | 12/1994 | Gutierrez et al. | 174/261 |
| 5,428,190 | 1/1995 | Stopperan | 174/261 |

OTHER PUBLICATIONS

Scheinfeld, I., Grafting of Polymers by Purely Chemical Means, *Polymer News*, vol. II, No. 11/12, pp. 19–25.
High Performance Polymers and Composites, Encyclopedia Reprint Series, John Wiley & Sons, pp. 174–219.

*Primary Examiner*—Laura Thomas
*Attorney, Agent, or Firm*—Weingarten, Schurgin, Gagnebin & Hayes LLP

[57] ABSTRACT

An electrical device is provided having a conductive coating or layer chemically grafted to a support substrate to produce a durable, conductive surface permanently attached to the underlying substrate material. The grafted layer can be embodied in an electrical contact, and can also be embodied as electrical traces and contact areas of circuit boards and electrical and electronic devices and components. In another embodiment, the grafted layer can be provided in an RFI/EMI shield or ground plane.

14 Claims, 12 Drawing Sheets

CHEMICALLY GRAFTED ELECTRICAL DEVICES

FIELD OF THE INVENTION

This invention relates to electrical devices and more particularly to devices employing a chemically grafted conductive coating.

BACKGROUND OF THE INVENTION

In the fabrication of electronic or electrical devices and circuits, conductive paths and contact areas are usually provided by chemical etching and photolithographic techniques as in the fabrication of printed circuit boards, and by plating techniques by which one or more metal layers are provided such as on electrical contacts or contact areas of circuit boards, devices and the like. Such fabrication techniques are well known and are widely employed. They do however require a number of process steps and specialized fabrication equipment which adds to the cost and complexity of the manufacturing process and of the resultant products.

SUMMARY OF THE INVENTION

This invention provides in one aspect an electrical device having a conductive coating or layer chemically grafted to a support substrate to produce a durable conductive surface permanently attached to the underlying substrate material. The invention can be embodied in an electrical contact having a contact surface which is part of a conductive layer chemically grafted to a supporting substrate. The substrate may be a rigid or flexible single or multiple layer circuit board, with the grafted contact areas provided in an intended pattern corresponding to the pattern of an integrated circuit or other electronic device or package to be electrically attached to the board. The conductive traces of the circuit board can also be grafted to the substrate. The substrate may also be an element of a switch or other electrical or electronic device on which one or more electrical contacts are formed by chemical grafting. In another aspect, the invention is embodied in an electrical shield or ground plane which may be provided, for example, on a circuit board, or other support structure to provide a shielding enclosure or ground plane. A shielding gasket or the like can also be provided by the invention.

The substrate can be a conductive or non-conductive material and can be rigid, flexible or resilient to suit the intended electrical device or circuit requirements. The conductive layer is composed of a chemically bonded conductive or non-conductive polymer matrix containing conductive particles. The conductive particles are each coated with a polymer material, the polymer coatings being chemically bonded together and to the substrate surface. The grafted layer may be a single layer of material or two or more layers of different materials to suit the particular application.

The polymer coated particles are typically contained within a slurry which is applied to intended areas of a supporting substrate surface. The slurry can be applied by many different techniques including dipping, screen printing, and spray coating as examples. The applied coating is heated to dry the coating and to form the chemically bonded conductive layer on the substrate surface. The conductive coating may also be applied by other techniques such as roller coating, brushing, transfer pad printing, ink jet printing, and atomization spraying.

A layer of homogenous conductive particles can be provided on the conductive grafted surface to provide a roughened and hardened surface by which an oxide or other contaminating layer on a mating electrical contact surface is penetrated to minimize contact resistance. The particulate surface contact is the subject of U.S. patent application Ser. No. 08/349,042, filed Dec. 2, 1994, (attorney docket number AUG-C-556XX), now U.S. Pat. No. 5,527,591.

DETAILED DESCRIPTION

In the foregoing examples, a conductive area or surface is provided by chemical grafting onto a substrate surface. The grafting technique is described in an article entitled "Grafting of Polymer by Purely Chemical Means", Polymer News, Volume II, No. 11/12, pp. 19–25, incorporated herein by reference.

The conductive material to be grafted to the substrate is composed of conductive particles, such as silver or other metal, each coated with a conductive or non-conductive polymer material. The particles are, in one preferred embodiment, contained within a slurry or other vehicle by which the particles are applied to a substrate surface. For example, the slurry containing the particles can be screen printed or sprayed onto a substrate to form intended conductive areas. The applied material is heated at a temperature and for a time sufficient to drive off the liquid vehicle and to cause the particles to be chemically bonded together and to be chemically bonded to the substrate surface. Optionally, a metal such as copper can be plated to the grafted layer, such as by electroless plating. The conductive particles are sufficiently proximate to each other to provide a layer of intended conductivity. When a non-conductive polymer coating is employed over the conductive particles, the coating is sufficiently thin and has sufficiently low resistivity to provide conduction between the closely packed conductive particles in the polymer matrix to yield an intended level of conductivity for the grafted layer. The level of conductivity of the grafted layer is ususally higher when a conductive polymer is employed.

Figure 16:
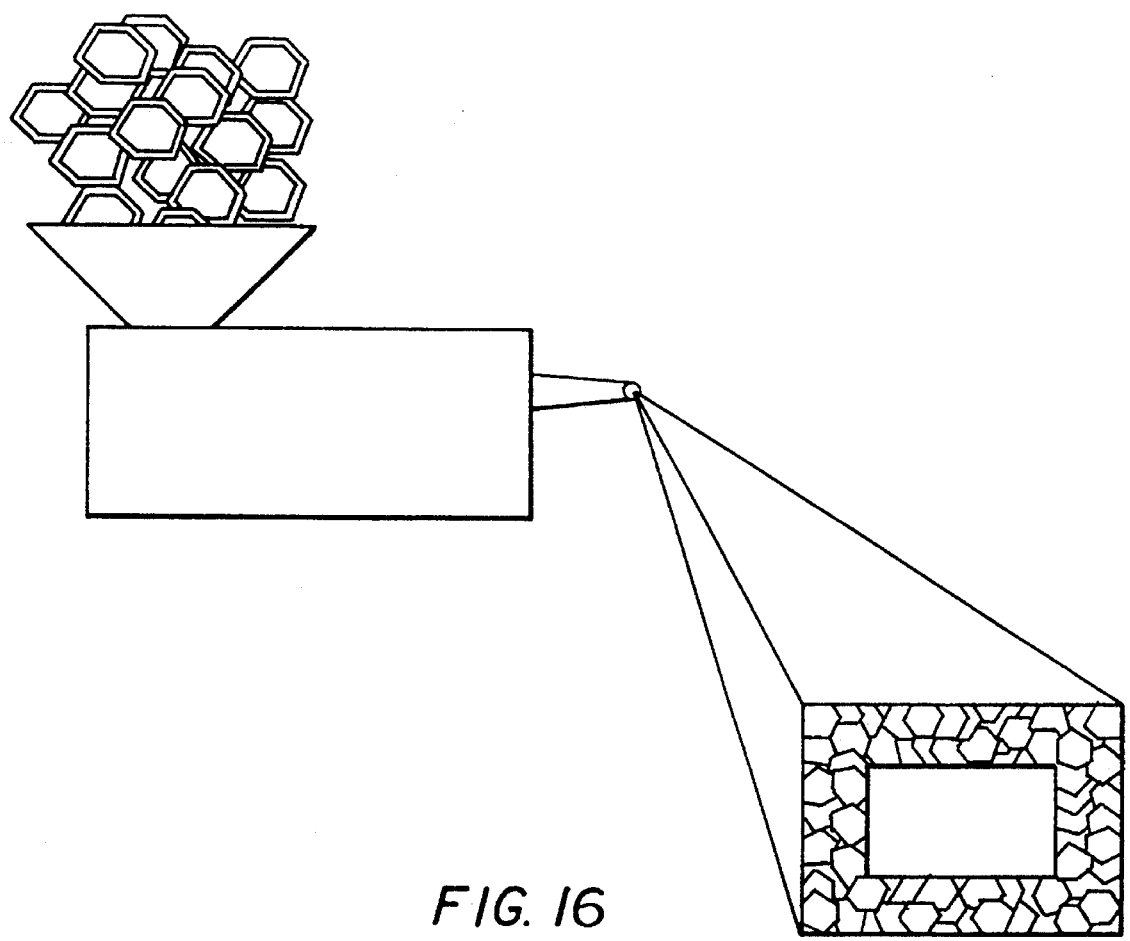
FIG. 16 diagrammatically illustrates one fabrication method according to the invention.

The particles can also be extruded or otherwise formed into a homogeneous conductive material as illustrated in FIG. 16. The conductive particles are supplied to an extrusion machine which produces a homogeneous extrusion of material in an intended shape.

The conductive layer typically has a thickness in the range of about 0.1 mil to about 2 mils. The particle coating typically has a thickness of about 10 to 50 Angstroms for non-conductive coatings, and about 10 to 250 Angstroms for conductive coatings. The conductivity of the uncoated particles is typically in the range of about 50 to 104 percent IACS. The conductivity of the coated particles are typically in the range of 20 to 60 percent IACS for non-conductive particle coatings, and about 60 to 110 percent IACS for conductive particle coatings.

Examples are given below of electrical devices having one or more conductive areas composed of chemically grafted coatings.

Figure 1A:
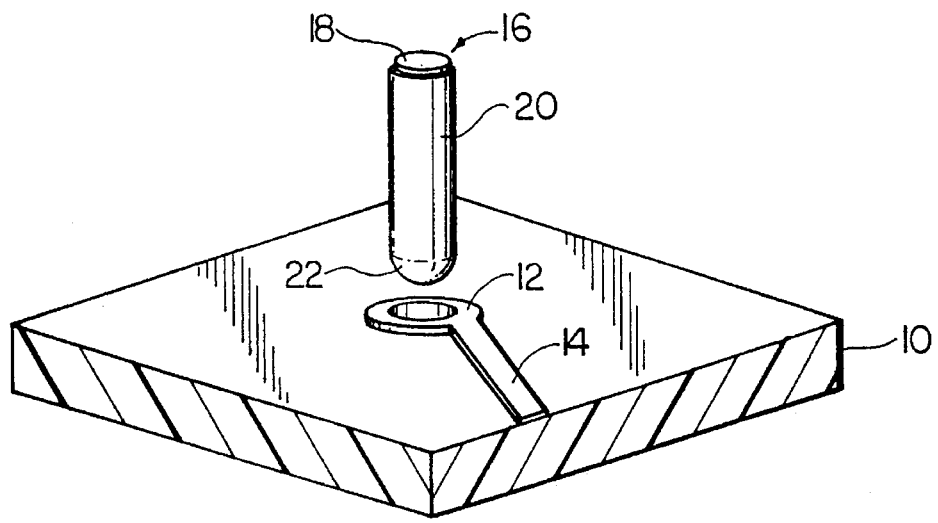
FIGS. 1a and 1b illustrate one embodiment in which a grafted electrical terminal pin embodying the invention is inserted and retained in a conductive opening.
Figure 1B:
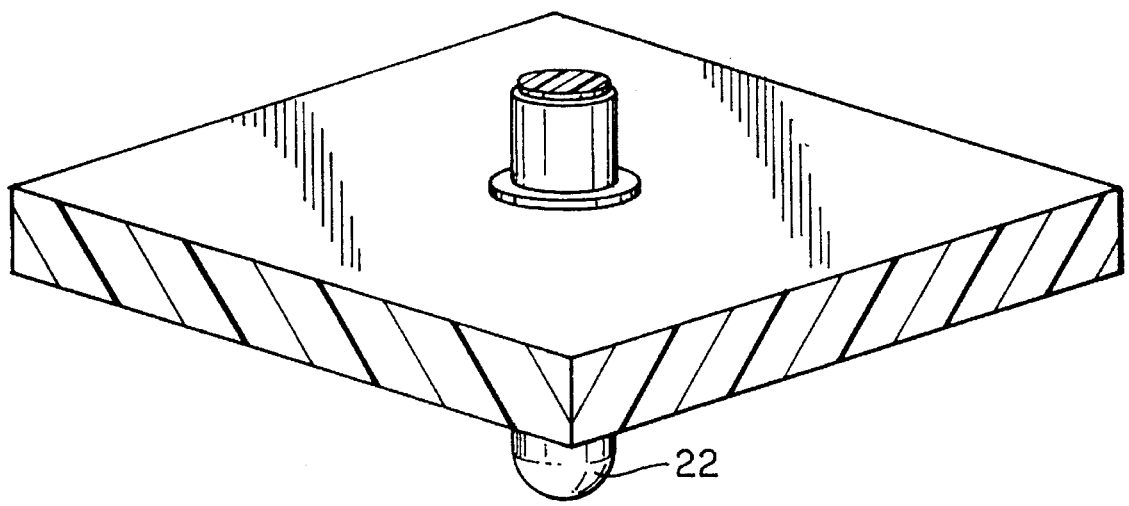

Referring to FIGS. 1a and 1b, there is shown a printed circuit board 10 having a plated through hole 12 which is electrically connected to one or more circuit traces 14 provided on or within the circuit board in known fashion. Electrical connection is made to the plated through hole by means of a pin 16 composed of a core 18 of thermosetting material having a conductive layer 20 grafted to the cylindrical surface and rounded end 22 of the pin 16. The pin in its initial condition is sized to be inserted into the plated hole after which exposure to heat causes the core 18 of the pin to expand sufficiently to form a gas tight seal between the grafted conductive surface 20 and surrounding plating material of the through hole. The thermosetting material after its expansion due to heating remains in the expanded state and thereby provides a permanent gas tight seal. The pin 16 can be alternatively configured to mate with other electrical contact elements with which a permanent electrical connection is to be made.

Figure 2:
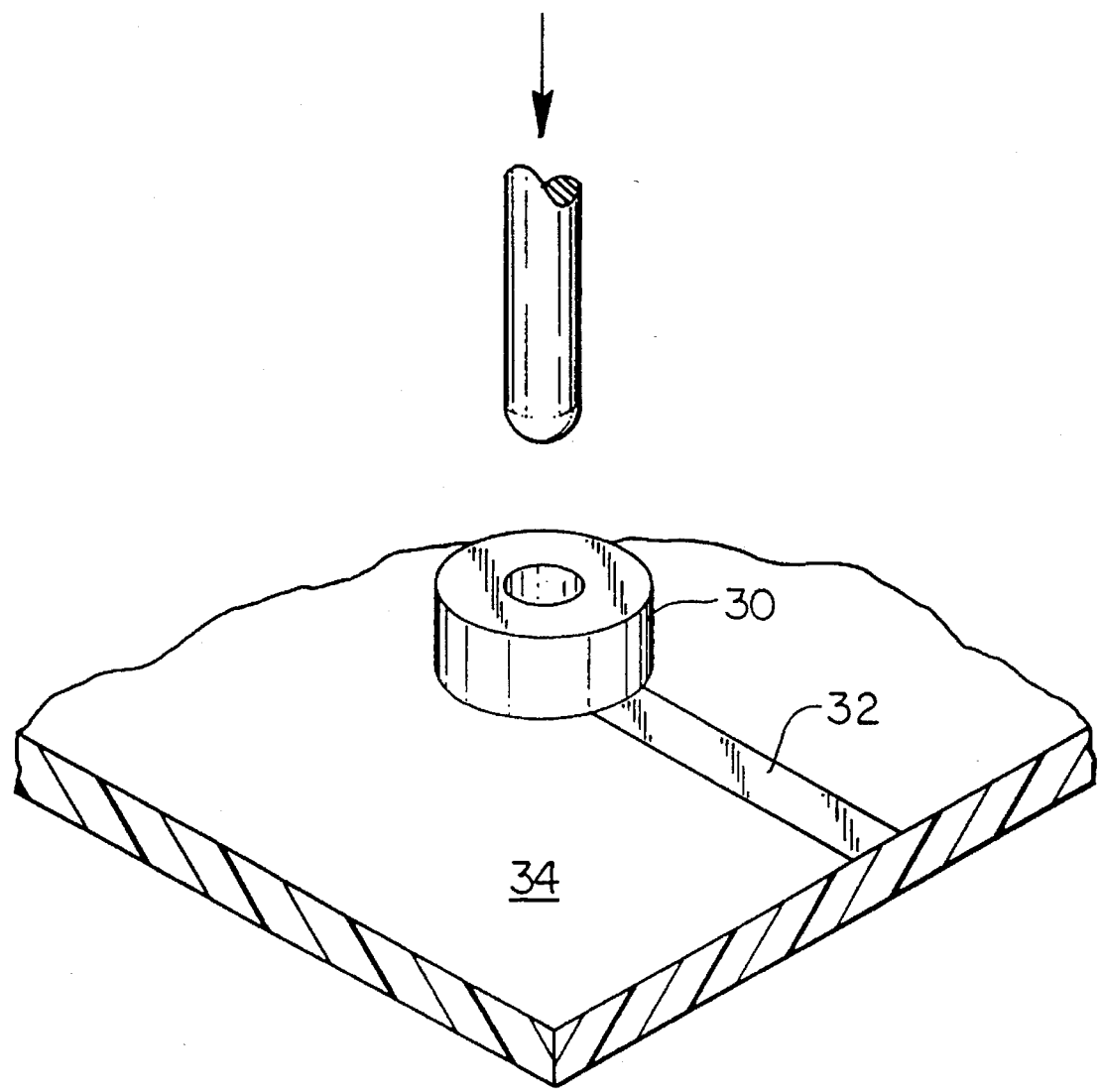
FIG. 2 illustrates an embodiment in which a resilient annular ring wall according to the invention provides contact with an electrical lead inserted through the ring.

Referring to FIG. 2, there is shown a grafted annular ring 30 which is connected to a circuit trace 32 of a printed circuit board 34. The ring is aligned around a hole through the circuit board and into which a lead of an electrical or electronic device is inserted. The grafted ring is composed of a resilient core of material such as silicon rubber, having a chemically grafted flexible conductive material on the surfaces of the core. The opening through the annular ring is slightly smaller than the diameter of the electrical lead or pin to be inserted therethrough such that compressive force is provided between the inserted lead and surrounding ring to maintain the lead in position. An array of resilient rings can be provided in a pattern corresponding to the lead pattern of a device to be connected to the circuit board.

The conductive coating is sufficiently flexible and resilient to not impede the resilience of the core material. The ring can compress when in contact with a mating electrical lead and expand when out of mating contact without peeling or cracking of the conductive coating on the surface of the ring.

The resilient interconnect ring can be fabricated by molding the core material in the desired shape. A metallization is applied to the ring surfaces preferably by chemical grafting, and the particulate layer is then applied to the surface of the metallization layer. Copper or other metal may optionally be electroless plated onto the metallization layer prior to application of the particulate layer.

Figure 3:
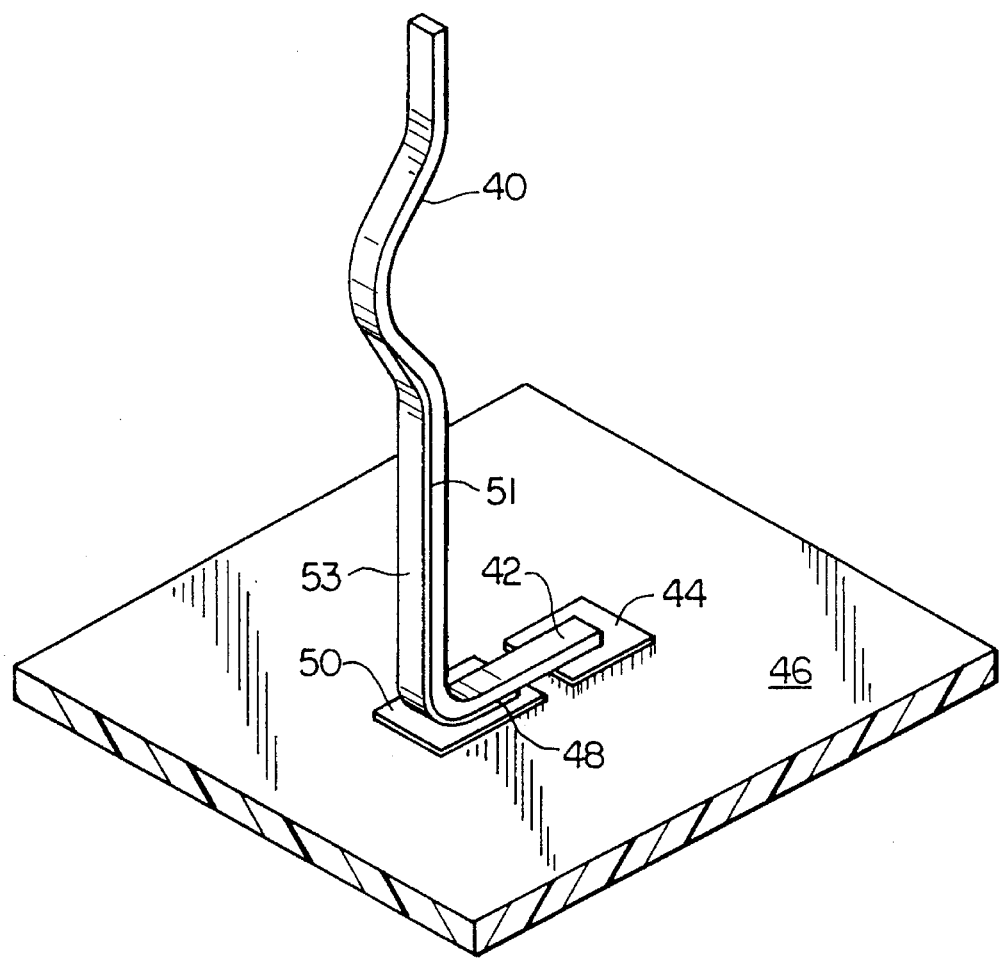
FIG. 3 illustrates a controlled impedance contact made according to the invention.

Referring to FIG. 3, there is shown a conductive element 40 having a signal contact 42 engaged with a signal pad 44 of a circuit board 46, and a ground contact 48 engaged to a ground pad 50 of the circuit board. The conductive element is typically formed of a contact material such as phosphor bronze or beryllium copper. An insulating layer 51 is disposed along a portion of the contact element and over which a conductive layer 53 is grafted to provide a ground plane. The contact structure thus formed has a controlled electrical impedence defined by the dimensions and materials employed.

Figure 4:
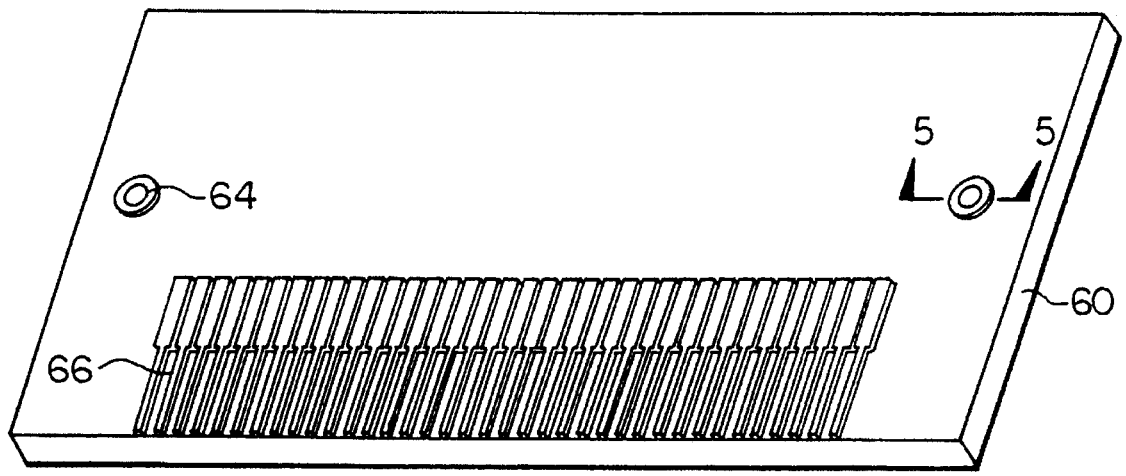
FIG. 4 shows a printed circuit board utilizing the invention.
Figure 5:
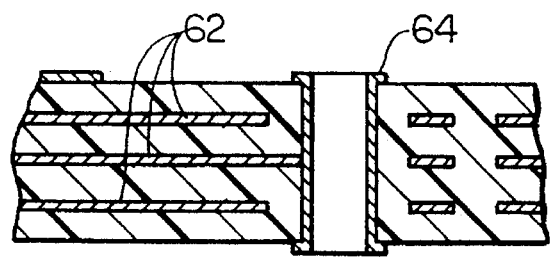
FIG. 5 is a sectional view taken along lines 5—5 of FIG. 4.

FIGS. 4 and 5 show a multilayer printed circuit board 60 having three inner conductive patterns 62 for providing an intended circuit configuration, one of the circuit patterns being electrically connected to a conductive via 64 or through hole as shown. An array of conductive contacts 66 is provided on one surface of the circuit board. A pattern of circuit traces can also be formed on one or both outer board surfaces. All of the conductive elements of the multilayer board can be provided by chemical grafting. Alternatively, some conductive elements can be formed by other means while some of the conductive elements are formed by grafting.

Figure 6:
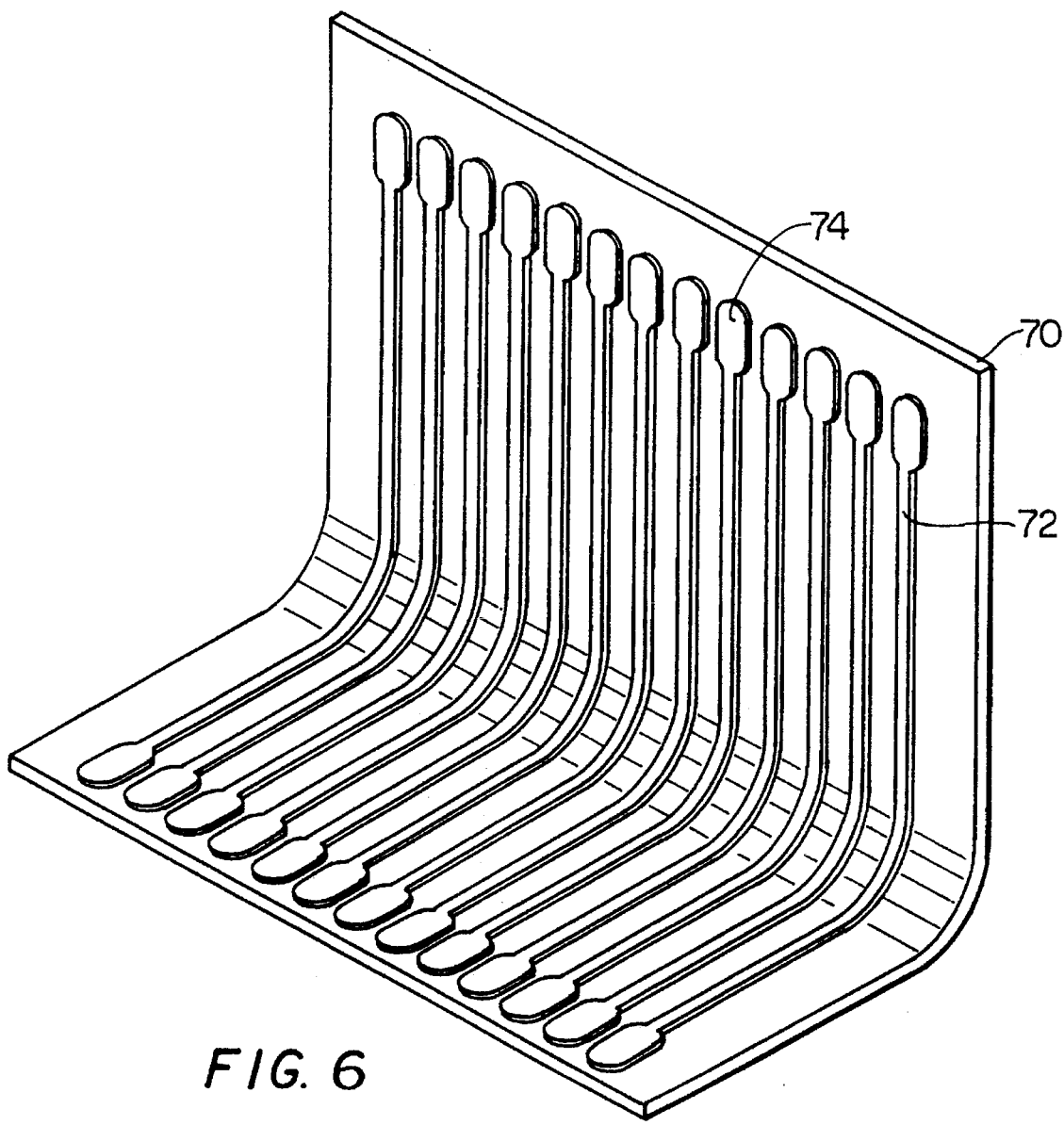
FIG. 6 shows a flexible circuit board made according to the invention.

FIG. 6 illustrates a flexible circuit board 70 having an array of parallel traces 72 and contact areas 74 formed by grafting on a surface of the flexible substrate. Similar circuit traces and/or contact areas can be provided on the opposite flexible board surface, as well as in buried layers within a multilayer board structure.

Figure 7:
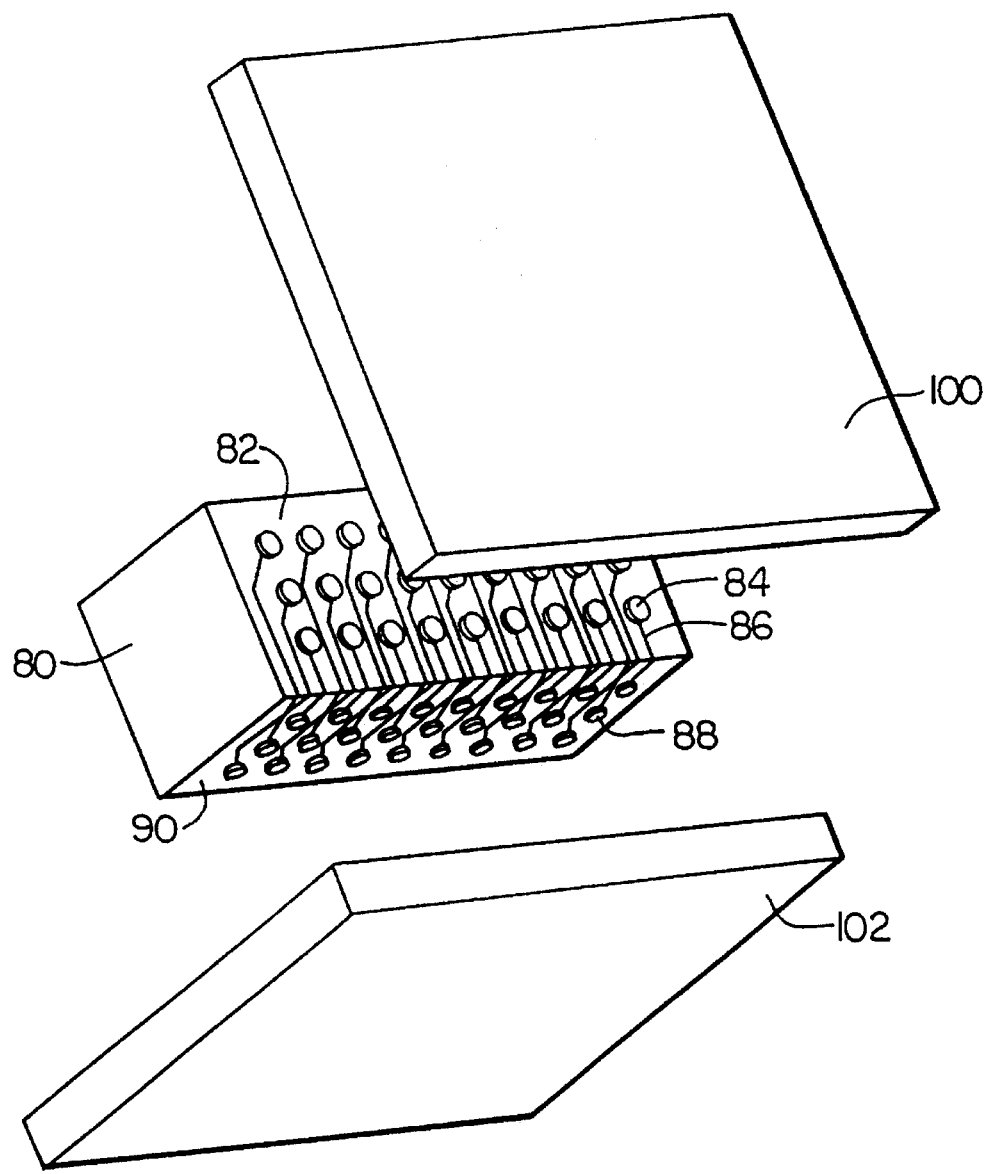
FIG. 7 shows a board-to-board connector employing the invention.

A further embodiment is illustrated in FIG. 7 which shows a right angle board to board connector which includes a connector body 80 of a suitable insulating material, having on a first face 82 a plurality of conductive contact areas 84 arranged in an intended pattern, and electrically connected via conductive traces 86 to corresponding contact areas 88 provided on an orthogonal face 90 of the body. In use, the contact areas 84 are mated to corresponding contact areas of printed circuit board 100, and contact areas 88 are mated to corresponding contact areas of printed circuit board 102. The interconnection assembly of the two circuit boards and connector body is maintained by a suitable mechanism (not shown), and is known in the connector art.

Figure 7A:
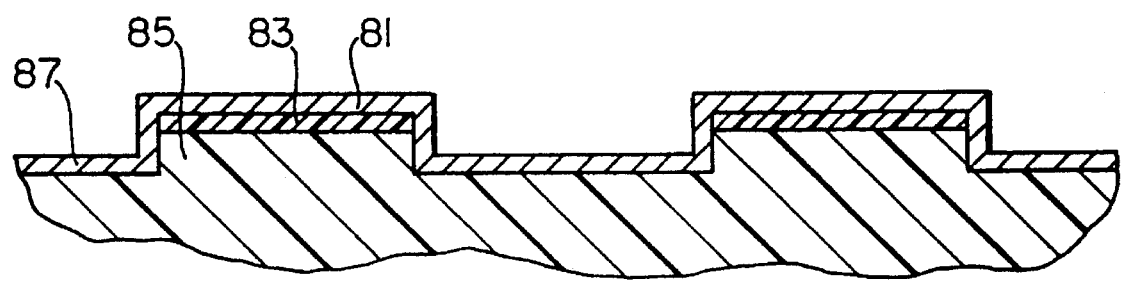
FIG. 7a is a partial elevation view of one form of contact structure for the connector of FIG. 7.

The contact areas and traces are chemically grafted to the underlying surfaces of the body. The surfaces of the body on which the contact areas are formed may have raised pedestal areas and which may have a resilient layer on which the conductive layer is provided. Referring to FIG. 7a, a conductive layer 81 is grafted to a resilient layer 83 on the raised pedestal 85. The conductive layer 81 is in electrical interconnection with the respective traces 87. The connector body 80 may alternatively be of a resilient or elastomeric material which is compressed during engagement of the contact areas with the associated circuit boards to provide contact pressure. Alternatively, the contact areas and corresponding traces can be provided on a resilient sheet which is supported on a rigid material.

Figure 8:
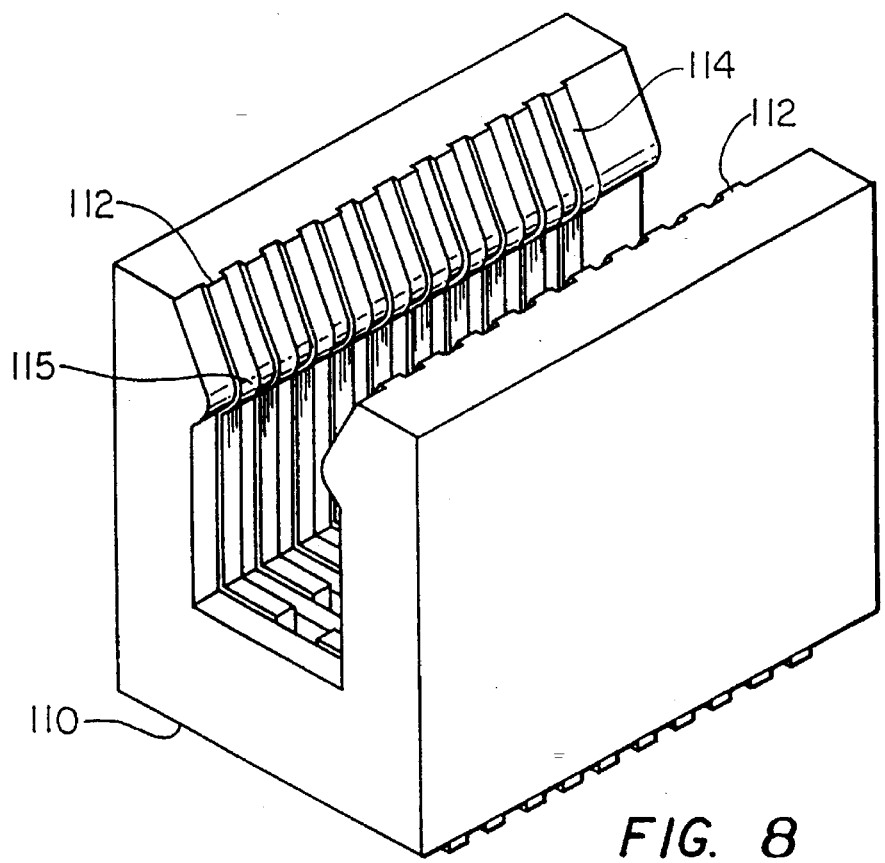
FIG. 8 shows an edge card connector fabricated according to the invention.
Figure 9A:
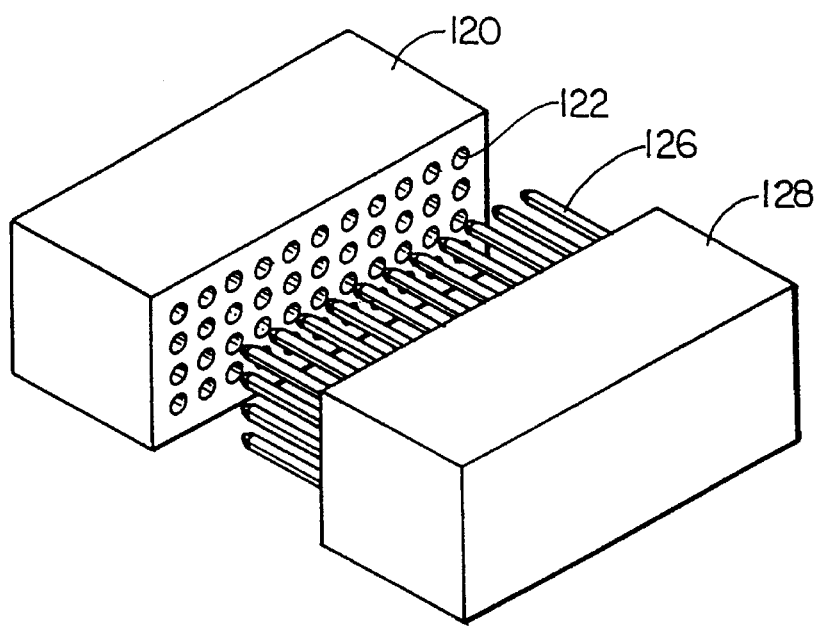
FIGS. 9a through 9d show respective views of a terminal pin interconnect embodying the invention.
Figure 9B:
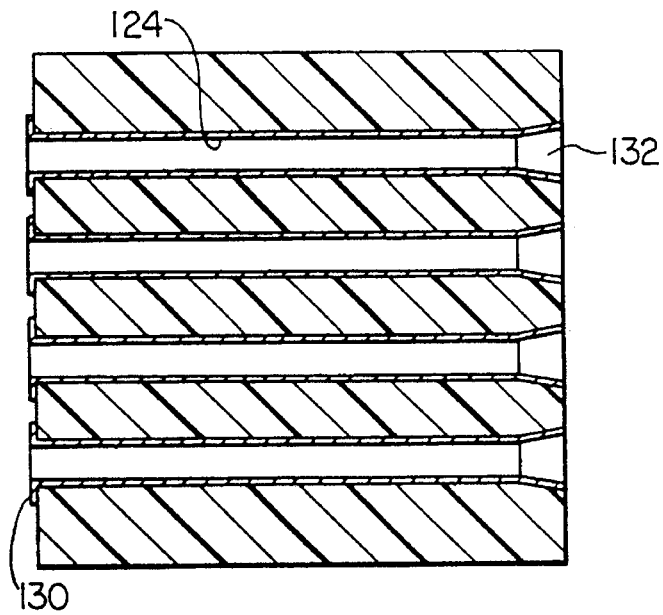
Figure 9C:
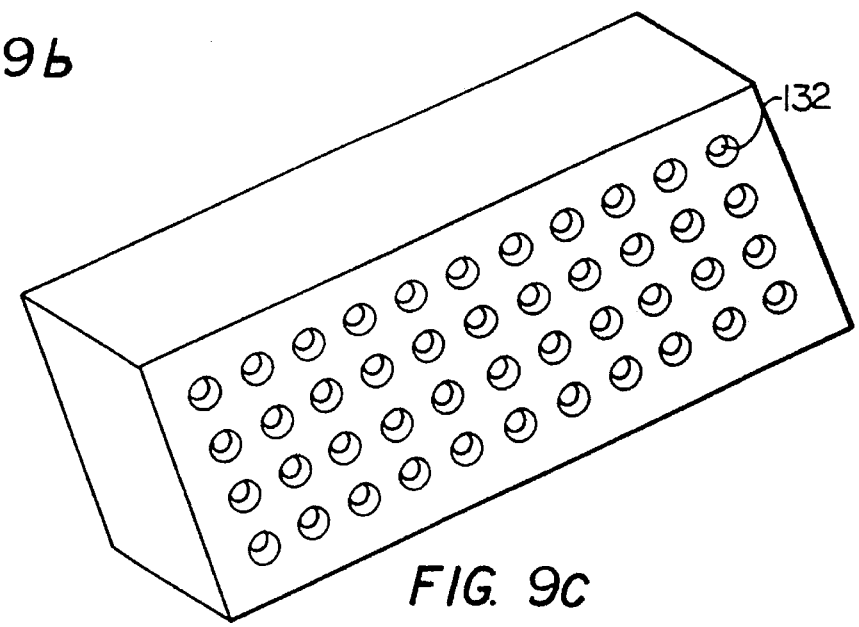
Figure 9D:
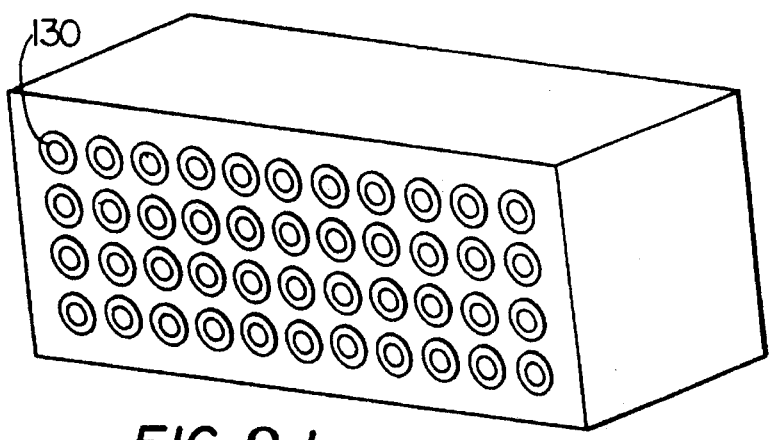

Referring to FIG. 8, an edge card connector is shown which comprises a body 110 of elastomeric material having a plurality of raised ridges 112 onto each of which a grafted conductor 114 is provided. The conductors extend down respective sides of the body as illustrated and through openings in the bottom portion of the body and thence along the bottom surface of the body. A circuit board or circuit card having contact areas corresponding to the contact areas of the connector is inserted into the connector body for engagement with the respective contact areas 115 of the connector. The illustrated edge card connector has connectors on opposite sides to engage opposite rows of contact areas of a double sided circuit board or card. It will be recognized that single sided connectors can also be provided by the invention to engage and make contact with single sided circuit cards. Various other connector configurations are also contemplated to accommodate various electrical and electronic interconnect applications and configurations.

Another embodiment is illustrated in FIGS. 9a through 9d wherein grafted conductive areas are provided within openings of a female socket or interconnect. The interconnect body 120 has a plurality of holes 122 therethrough each of which has grafted conductive surfaces 124 for electrical contact of corresponding electrical pins 126 of a mating connector 128. Each of the conductive areas of the interconnect openings terminate on the back surface in an annular contact area 130 for mating with appropriate circuit board or other interconnections. Each of the connector openings can have an outwardly flared entry section 132 which also has the conductive coating.

Figure 10:
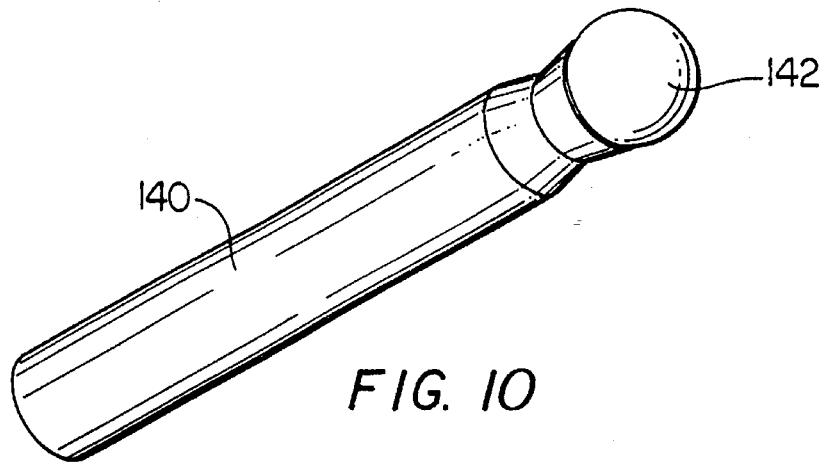
FIG. 10 shows a test probe embodying the invention.

Referring to FIG. 10, there is shown an electrical test probe having a probe body 140 with an elastomeric spherical probe tip 142 secured at one end. The tip is an elastomeric ball having a grafted conductive surface. The probe body has a conductive surface or may be of conductive material such as metal. The probe body is retained within a suitable fixture to position the tip over the contact area and to compress the tip against the contact area for electrical engagement therewith.

Figure 11A:
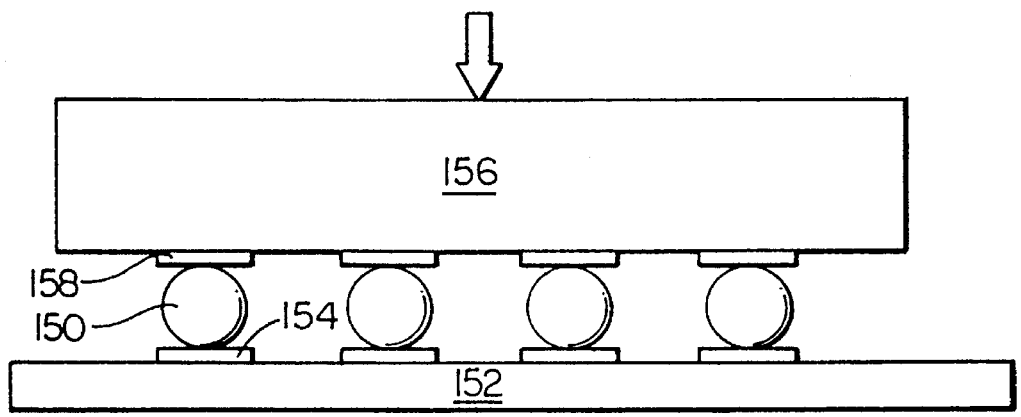
FIGS. 11a and 11b illustrate an elastomeric interconnect embodying the invention.
Figure 11B:
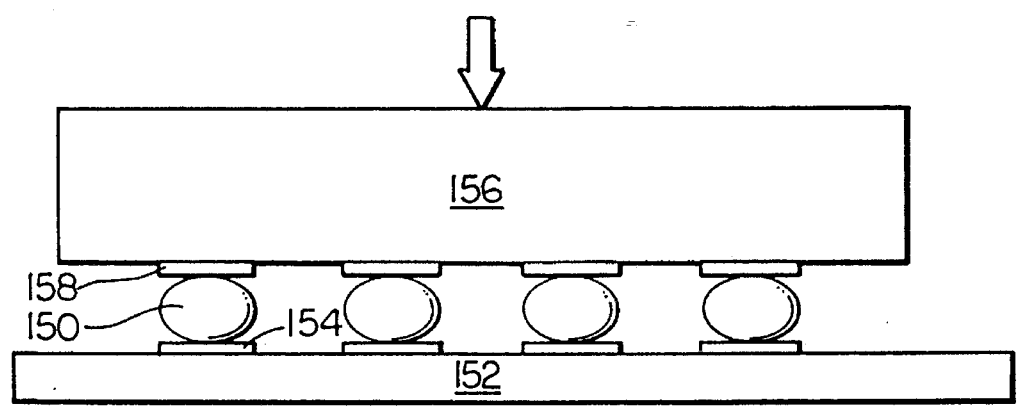

Elastomeric spheres with grafted conductive surfaces can also be embodied in an interconnection device as shown in FIGS. 11a and 11b. The spheres 150 are retained within a suitable housing (not shown) which is interposed between a printed circuit board 152 having conductive pads 154 and an electronic device 156 also having conductive pads 158. The device is forced toward the printed circuit board against the biasing of the elastomeric spheres and the pad areas of the device and circuit board are interconnected by the interposed conductive spheres. The device is maintained in contact engagement with the circuit board by a suitable socket mechanism (not shown). The elastomeric balls or spheres 150 may themselves be made of a conductive elastomeric material upon which the grafted conductive surface is formed.

Figure 12A:
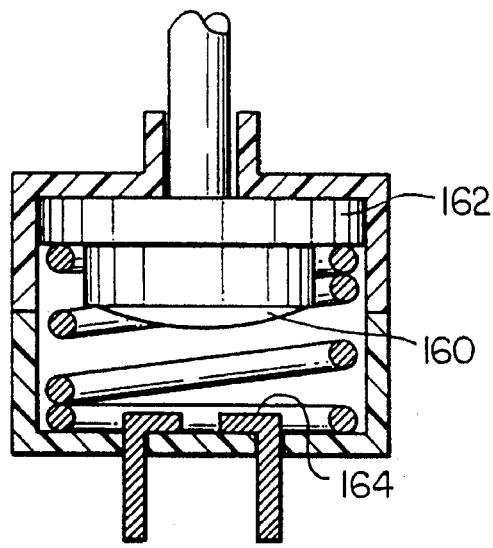
FIGS. 12a through 12d illustrate electrical switch devices employing the invention.

The invention can also be usefully employed in the fabrication of electrical switches, such as shown in FIGS. 12a through 12d. In each of these switches, a conductive contact area is grafted to the actuator which is of a plastic or other non-conductive material. The electrical terminals on the switch housing can be of conventional stamped metal construction and these terminals have contact areas which are selectively engaged upon actuation of the switch actuator to provide switch closure or opening depending on particular switch contact configuration. Alternatively, the switch terminals provided on the case can be chemically grafted. A pushbutton switch is shown in FIG. 12a in which a grafted conductive contact area 160 is provided on the actuator 162.

Figure 12B:
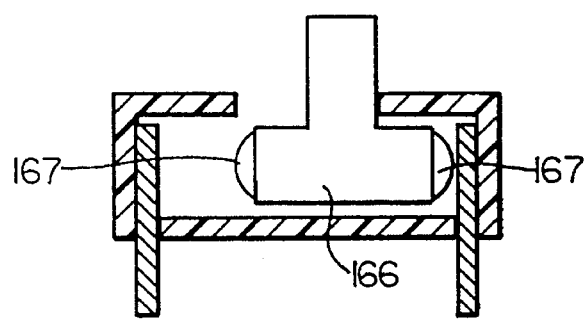
Figure 12C:
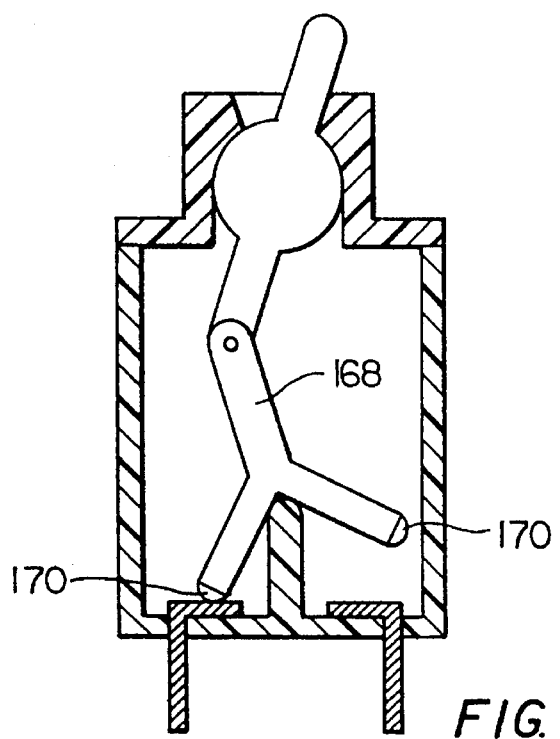
Figure 12D:
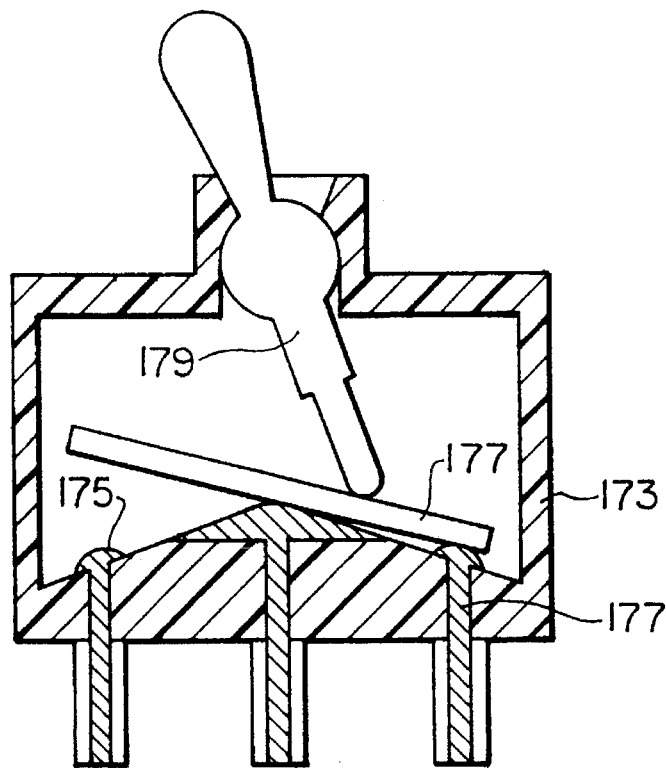

Upon manual depression of the actuator, the contact area engages the confronting contact areas 164 of the switch terminals. It will be appreciated that various switch configurations can be provided to provide intended switch operation. A slide switch is shown in FIG. 12b in which the slidable actuator 166 includes grafted contact areas 167 on respective ends. A toggle switch is depicted in FIG. 12c in which the toggle mechanism 168 includes grafted contact areas 170. FIG. 12d illustrates a switch case or housing having grafted conductive paths which provide electrical terminals and contact areas of the switch. In the structure of FIG. 12d, the grafted terminals 171 can be made by a multiple molding process. Plastic posts have a conductive coating grafted thereon, and these posts are then molded to the plastic housing 173 to which grafted contact areas 175 are provided as illustrated in electrical connection with the grafted terminals. The terminals 175 are selectively interconnected by a conductive strip 177 which is actuated by toggle mechanism 179.

Figure 13:
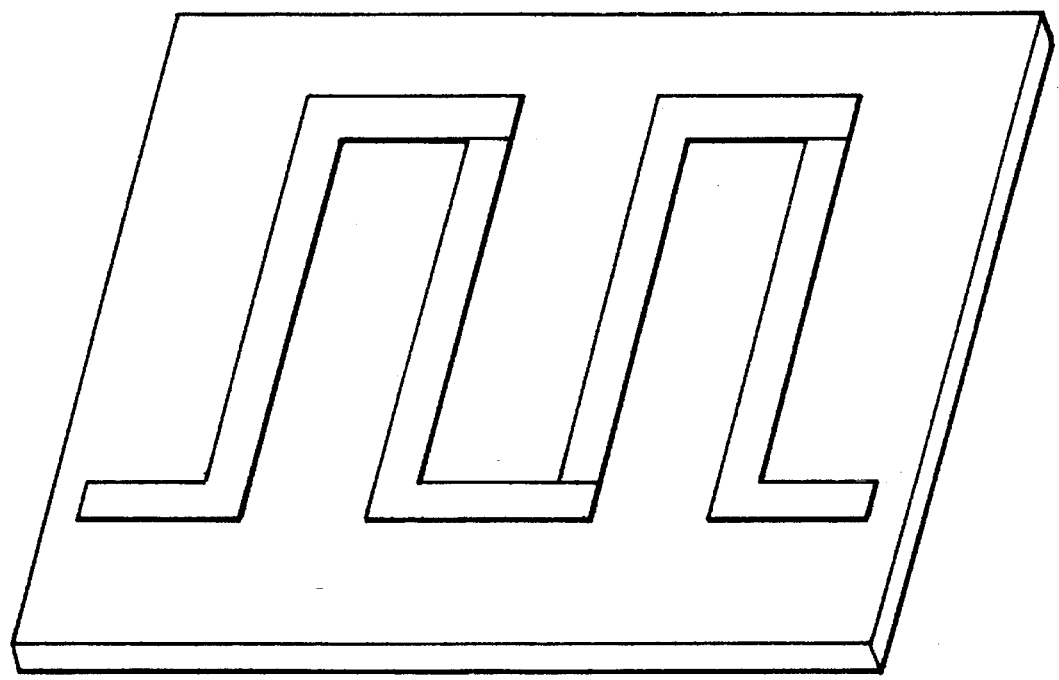
FIG. 13 illustrates an acoustic wave or microwave device embodying the invention.

The invention can also be embodied in a surface wave device as shown in FIG. 13, such as for surface acoustic wave or microwave applications. A substrate typically of alumina has formed thereon a pattern of one or more materials suitable for propagation of an acoustic wave or microwave. For acoustic wave purposes, the pattern is typically formed of antimony and bismuth, both of which are deposited and chemically grafted to the ceramic substrate.

Figure 14:
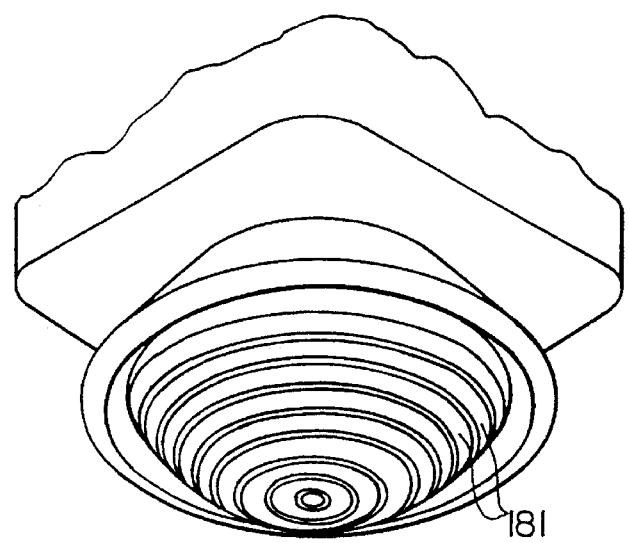
FIG. 14 illustrates a metallized diaphragm made according to the invention.

A further embodiment is shown in FIG. 14 wherein a conductive pattern 181 is provided by chemical grafting on a non-conductive substrate surface which in the illustrated embodiment is of dome shape. The diaphragm is sensitive to an intended characteristic such as heat, vibration or pressure and to deflect or deform to cause relative movement of the conductive traces of the pattern 181 to produce an electrically sensible signal change.

Figure 15:
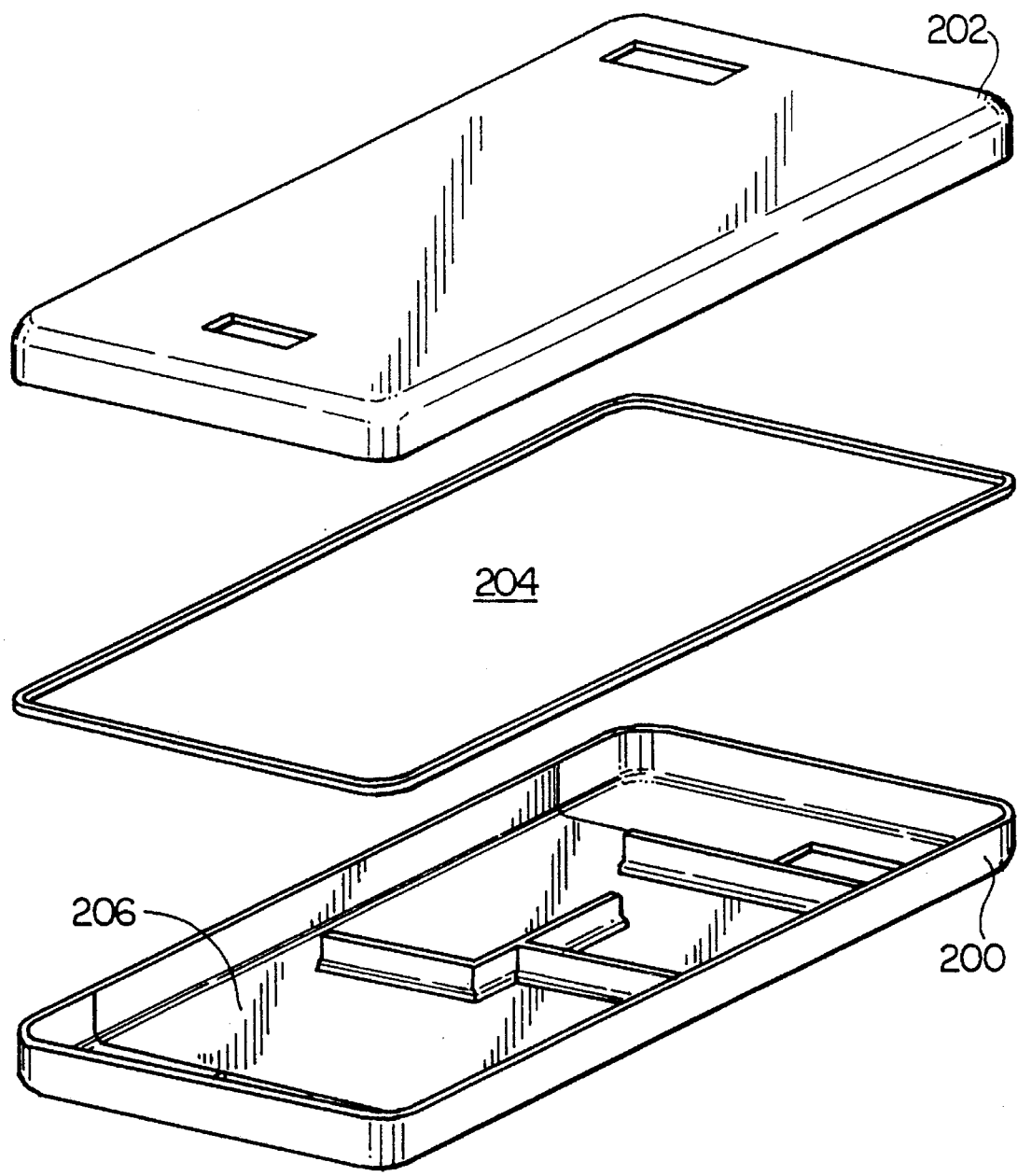
FIG. 15 illustrates an electrically shielded enclosure embodying the invention.

FIG. 15 shows an enclosure or case for an electronic circuit board, the enclosure having electrical shielding layers provided on the inner surfaces by chemical grafting to the two halves of the case or enclosure. The case is typically formed in two halves 200 and 202 such as by plastic molding, and is configured to retain a circuit board 204 therein. A conductive coating 206 is grafted to the inside surfaces of the case to provide RFI and/or EMI shielding. The shield coating is applied to the inside surfaces of the case typically by screening and subsequent heating to catalyze the coating and provide the grafted layer.

The invention is not to be limited by what has been particularly shown and described, as alternative implementations will occur to those skilled in the art without departing from the true scope of the invention.

We claim:

1. An electrical device comprising:

a substrate having a surface;

a conductive layer composed of a plurality of conductive particles each having a conductive coating;

the conductive coatings of the particles being chemically bonded together and to the substrate surface.

2. The electrical device of claim 1 wherein the conductive layer is composed of a plurality of conductive particles each having a conductive polymer coating.

3. An electrical material comprising:

a substrate having a surface;

a conductive coating chemically bonded to the substrate surface, the conductive coating composed of a chemically bonded conductive polymer matrix containing conductive particles.

4. The electrical material of claim 3 wherein the substrate is non-conductive.

5. The electrical material of claim 4 wherein the substrate is rigid.

6. The electrical material of claim 4 wherein the substrate is flexible.

7. The electrical material of claim 4 wherein the conductive coating is applied to selected areas of the substrate surface.

8. The electrical material of claim 3 wherein the substrate is conductive.

9. The electrical material of claim 3 further including an additional conductive layer disposed over the conductive layer.

10. The electrical material of claim 3 wherein the conductive particles are metal.

11. The electrical material of claim 3 wherein the substrate is flexible and wherein the conductive coating is flexible.

12. An electrical interconnect comprising:

an elongated body of thermosetting material shaped to mate with a corresponding electrical contact element;

a conductive layer chemically grafted to at least a portion of the surface of the thermosetting material;

the thermosetting material being sized to be insertable into the mating electrical contact element and operative to expand in response to applied heat to form a permanent gas tight seal between the grafted conductive surface and a mating conductive surface of the electrical contact element.

13. An electrical interconnect comprising:

at least one annular ring having a resilient core and a chemically grafted conductive layer thereon;

the annular ring being disposed around and in alignment with an opening in a substrate, the conductive layer of the annular ring being in electrical contact with a conductive element on the substrate;

the opening through the annular ring being smaller than the dimension of an electrical terminal inserted therethrough such that a compressive force is provided between the inserted electrical terminal and the surrounding ring.

14. An electrical interconnect comprising:

a substrate of rigid material having on at least a portion of one surface thereof a resilient material; and a conductive material chemically grafted to the exposed surface of the resilient material to provide a flexible conductive contact area, said conductive material composed of a chemically bonded polymer matrix containing conductive particles.

* * * * *